United States Patent [19]
Kelsey et al.

[11] Patent Number: 5,894,887
[45] Date of Patent: *Apr. 20, 1999

[54] CERAMIC DOME TEMPERATURE CONTROL USING HEAT PIPE STRUCTURE AND METHOD

[75] Inventors: Shannon J. Kelsey; Philip M. Salzman, both of San Jose, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/565,522

[22] Filed: Nov. 30, 1995

[51] Int. Cl.$^6$ .................................................. F28F 7/00
[52] U.S. Cl. .................. 165/80.2; 165/80.1; 165/104.26; 165/169; 118/724; 118/725
[58] Field of Search ............... 165/80.5, 80.4, 165/80.2, 80.1, 185, 104.33, 168, 169, 104.26; 118/725, 724; 156/345

[56] References Cited

U.S. PATENT DOCUMENTS

| | | | |
|---|---|---|---|
| 4,047,198 | 9/1977 | Sekhon et al. | 165/80.4 X |
| 4,131,158 | 12/1978 | Abhat et al. | 165/104.14 |
| 4,147,814 | 4/1979 | Yatsurugi et al. | 118/725 X |
| 4,331,128 | 5/1982 | Gebhardt | 165/104.26 X |
| 4,527,620 | 7/1985 | Pedersen et al. | 165/80.5 |
| 4,753,154 | 6/1988 | Higashi | 165/104.26 X |
| 5,033,407 | 7/1991 | Mizuno et al. | 118/725 |
| 5,054,420 | 10/1991 | Raghavan et al. | 118/725 X |
| 5,062,386 | 11/1991 | Christensen | 118/725 |
| 5,203,958 | 4/1993 | Arai et al. | 156/345 X |
| 5,364,488 | 11/1994 | Minato et al. | 156/345 |
| 5,490,228 | 2/1996 | Soma et al. | 118/725 X |
| 5,508,884 | 4/1996 | Brunet et al. | 165/80.4 X |

FOREIGN PATENT DOCUMENTS 2357986  2/1978  France ....................... 165/104.33

Primary Examiner—Ira S. Lazarus
Assistant Examiner—Christopher Atkinson
Attorney, Agent, or Firm—Janis Biksa

[57] ABSTRACT

This invention relates to a structure and method for using heat pipe technology in combination with a ceramic dome of a vacuum processing chamber to help maintain the uniformity of temperature in the dome and avoid differences in temperature in the dome which may cause deleterious flaking of process deposition, or allow elevated temperatures in the dome to cause premature wear of the material. A heat pipe can be in thermal contact with the dome (process chamber surface) or can actually be part of the heat pipe/dome structure.

8 Claims, 6 Drawing Sheets

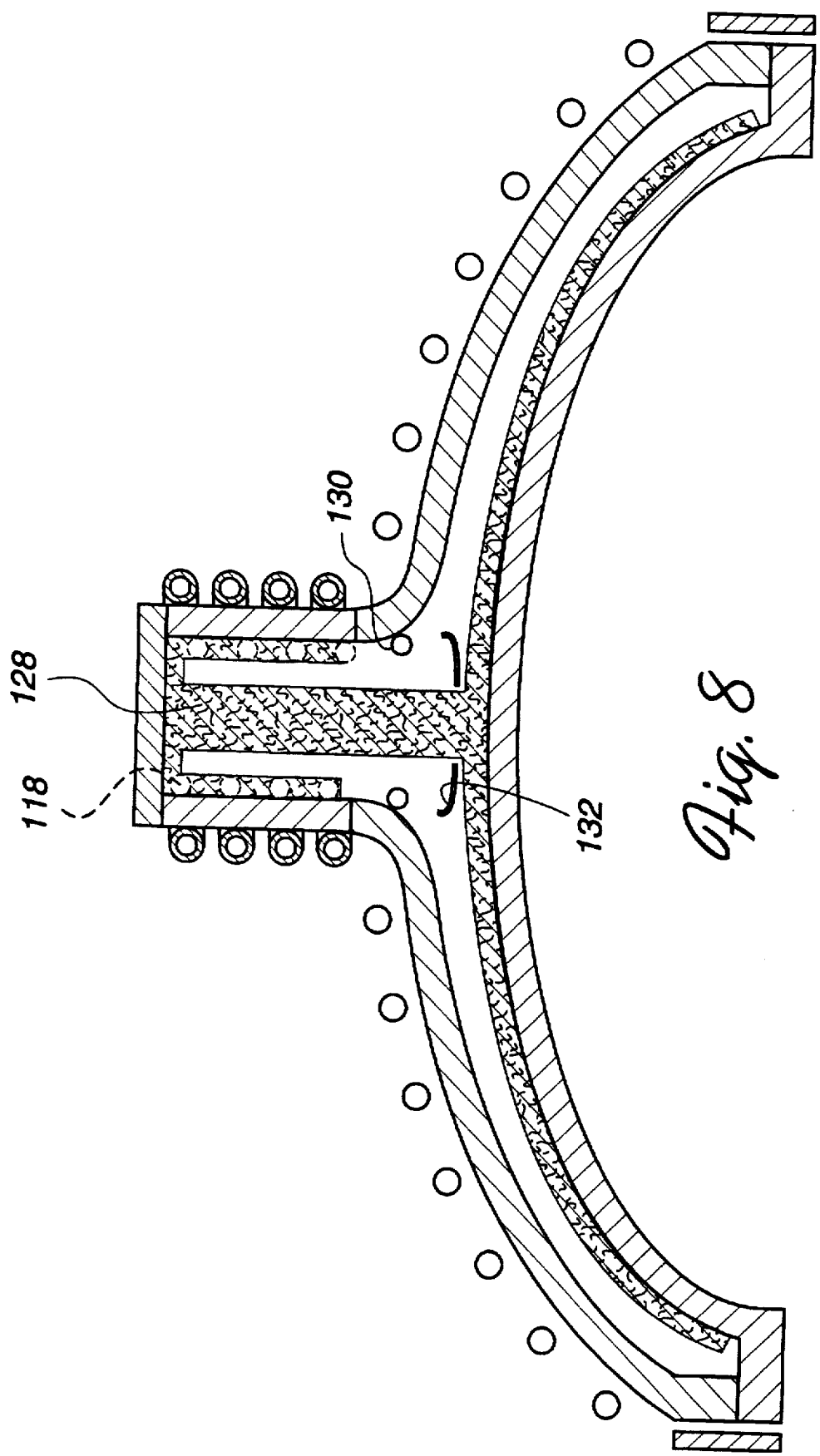

5,894,887

CERAMIC DOME TEMPERATURE CONTROL USING HEAT PIPE STRUCTURE AND METHOD

FIELD OF THE INVENTION

This invention relates to a structure and method for controlling the surfaces of a substrate processing chamber which incorporates and/or is combined with a configuration and method of using a thermal conductor incorporating a heat pipe.

BACKGROUND OF THE INVENTION

In processing substrates (for example semiconductor substrates—wafers) in vacuum chambers the temperature and variations in temperature of the vacuum chamber surfaces exposed to the substrate can and do affect the uniformity and quality of wafer processing. This is particularly true in vacuum chambers where chemical vapor disposition (CVD) of substrates occurs, where variations in temperature can affect the uniformity of a film layer deposited on the substrate or can cause flaking of film particles from the inside of the dome onto the substrate being processed as a result of differential thermal expansion.

In a processing chamber configuration as shown in FIG. 1, a substrate processing location 24 is located within a substrate vacuum processing chamber 20 and is surrounded by chamber walls 22 and covered by a ceramic dome 28. A series of arrows 36 show locations where processing gas enters the chamber. The vacuum system connection 26 provides for the gas exhaust once the gas has been depleted during processing. The chamber shown is commonly used for a plasma enhanced process where the high ceiling in the chamber provides generally uniform ion density at the surface of the substrate being processed at the substrate processing location 24. The gas, once it enters the processing chamber, is ionized by RF coils 30 in a coil framework 32 which is supported by a coil support member 34. The RF coils generate an electromagnetic field which ionizes the process gas creating a plasma with a generally uniform ion concentration at the substrate processing location 24. A variation in the temperature across the inside surface of the ceramic dome 28 can and does cause a variation in the thermal expansion of the dome and can cause any materials deposited on the inside surface of the dome to flake off during nonuniform heating and cooling.

To avoid negative effects as a result of the differential temperatures across the inside surface of the ceramic dome 28, a uniform temperature of the dome is desired. A cooling structure for use with a ceramic dome through which an RF coil generates a magnetic field must meet the requirements that it be transparent to the RF frequency field so that it does not affect the uniformity of ion concentration from the plasma generated from the RF coils so that the uniformity of ion concentration across the substrate being processed is not deleteriously affected by inclusion of such a cooling structure.

SUMMARY OF THE INVENTION

This invention relates to a structure and method for using heat pipe technology in combination with a ceramic dome (chamber internal surface) of a vacuum processing chamber, similar to the one shown in FIG. 1, to help maintain the uniformity of temperature in the dome and on its internal surface to avoid differences in temperature in the dome which may cause deleterious flaking or allow elevated temperatures in the dome to cause premature wear of the dome ceramic material.

The heat pipe is extremely simple and relies on elementary concepts. The heat pipe is essentially nothing more than a boiler for heat addition, connected to a condenser for heat removal with a vapor, with a condensate pump for returning condensed fluids to the boiler section. In its simplest form there are only three parts: (1) a sealed enclosure of metal or glass, (2) a wick that acts as a condensate pump to move fluid by capillary action, and (3) a working fluid that actively transports the heat. A simple heat pipe is symmetrical throughout, and any portion may become the boiler or condenser.

When heat is absorbed in one part of the container that part becomes the boiler. The working fluid in that area evaporates, absorbing the latent heat of vaporization. As vapor evolves in the input section, it flows by seeking a lower vapor pressure, to the cooler sections of the container where it surrenders its latent heat. Thus a net transport of heat occurs from the boiler to the condenser. The wick then transports the condensed fluid back to the boiler section. (How Heat Pipes Work, Don W. Noren, *Chemical Engineering Magazine*, Aug. 19, 1974.)

In one configuration according to the invention a heating band surrounds the outside perimeter of the dome to reduce the heat loss from the perimeter, as that is the location of greatest natural heat loss. A cooling and/or heating facilitator such as a spirally wound heat pipe connected to a lower and upper reservoir provides heating and/or cooling of the top center of the ceramic dome as a result of conduction from the top of the ceramic dome through a thermally conductive filler material to the lower chamber. A cooling liquid (for example water or glycol) is circulated around the heat pipe structure in cooling liquid fluid passages (tubing) to act as a heat sink to help in maintaining the temperature of the reservoir. The liquid is generally cooling liquid to provide for extraction of thermal energy, however the temperature of the liquid could be such that it acts as a boiler for the heat pipe to assist in heating the ceramic dome during the time when energy input from the process is not present. Alternatively, a second heater band at the base of the heat pipe could provide this heat. The temperature at which the heat pipe maintains the ceramic dome (inside surface of the processing chamber) is set by the individual design of the heat pipe and by a built in thermostat on the heater band, as will be understood by persons of ordinary skill in the art. The normal operation of this heat pipe is for cooling. During cooling, the lower reservoir of the heat pipe acts as a boiler, which is heated through its contact with the surface of the process chamber. The boiler is not wrapped by cooling liquid fluid passages. The portions of the heat pipe above the lower reservoir (the heat pipe extension and upper heat pipe reservoir) are in thermally conductive contact with (e.g., soldered to) the cooling liquid tubing to cool the heat pipe and act as its condenser.

In an alternate configuration, the upper surface of the ceramic dome comprises the inside of a heat pipe/dome. A cover member encloses a portion of the upper surface and includes a reservoir portion around which cooling fluid coils are wrapped and attached. The configuration of the wick of the heat pipe is also dome and/or funnel shaped such that the vaporized liquid in the heat pipe expands until it encounters the upper cooling section (reservoir portion) of the heat pipe surrounded by cooling liquid coils. The condensation of the vapor in the section then allows the condensed liquid to drip on the wick and then through the capillary action of the wick to be evenly distributed over the surface of the ceramic dome.

In another configuration, only cooling is provided by a ceramic heat pipe/dome. The outside surface of the processing chamber ceramic dome again is part of the inside surface of the ceramic heat pipe/dome such that liquid collected in the wick, which when evenly distributed—as would be the case when enough fluid for saturation is provided, provides even temperature liquid across the whole top of the dome. Once the dome is heated by the thermal energy of the processing chamber, the heat transfer liquid is vaporized and expands into the cooled upper reservoir section and condenses on its surfaces. The condensed liquid forms droplets which run back down towards the dome section of the heat pipe/dome and there encounter a drip ring which causes the thermal liquid to drip onto a collection cup which directs the returning liquid to the center of the dome and the center of the wick so that there can be equal distribution of the returning thermal transfer liquid to all surfaces of the ceramic dome.

Another configuration provides a wick as before in a ceramic dome/heat pipe where the wick is continuous from its contact with the ceramic dome as well as has a center trunk which reaches up and into the cooling section of the structure. In this configuration heating by using liquid running through thermal coils will vaporize the heat pipe thermal transfer liquid which will then condense on the cold ceramic dome surface causing its temperature to rise. The condensed liquid will then be returned to the heated coils by capillary action of the liquid in the dome shaped wick as well as the central wick trunk rising and spreading along the walls of the cooling section which is generally cylindrically shaped. In its cooling mode, the temperature of the ceramic dome increases above the temperature of the cooling liquid being supplied to the ceramic dome and causes vaporization of the heat pipe heat transfer fluid from the surfaces of the ceramic dome. The vaporized liquid contacts cooler surfaces of the cooling section of the structure and condenses there. The condensed fluid can then either be wicked through the wick in contact with the walls of the cooling section or can run down the walls of the cooling section back towards the ceramic dome and encounter a drip edge from which causes the liquid to drip into a collection cup which returns the condensed liquid to the center of the wick for even distribution over the ceramic dome.

BRIEF DESCRIPTION OF THE DRAWINGS

FIG. 8 shows an alternate configuration for a wick in the heat ceramic dome/heat pipe configuration of structures generally shown in FIGS. 6 and 7, including a center trunk wick which connects the upper cylindrical section of the ceramic dome/heat pipe from the lower dome section.

DETAILED DESCRIPTION

Figure 1:
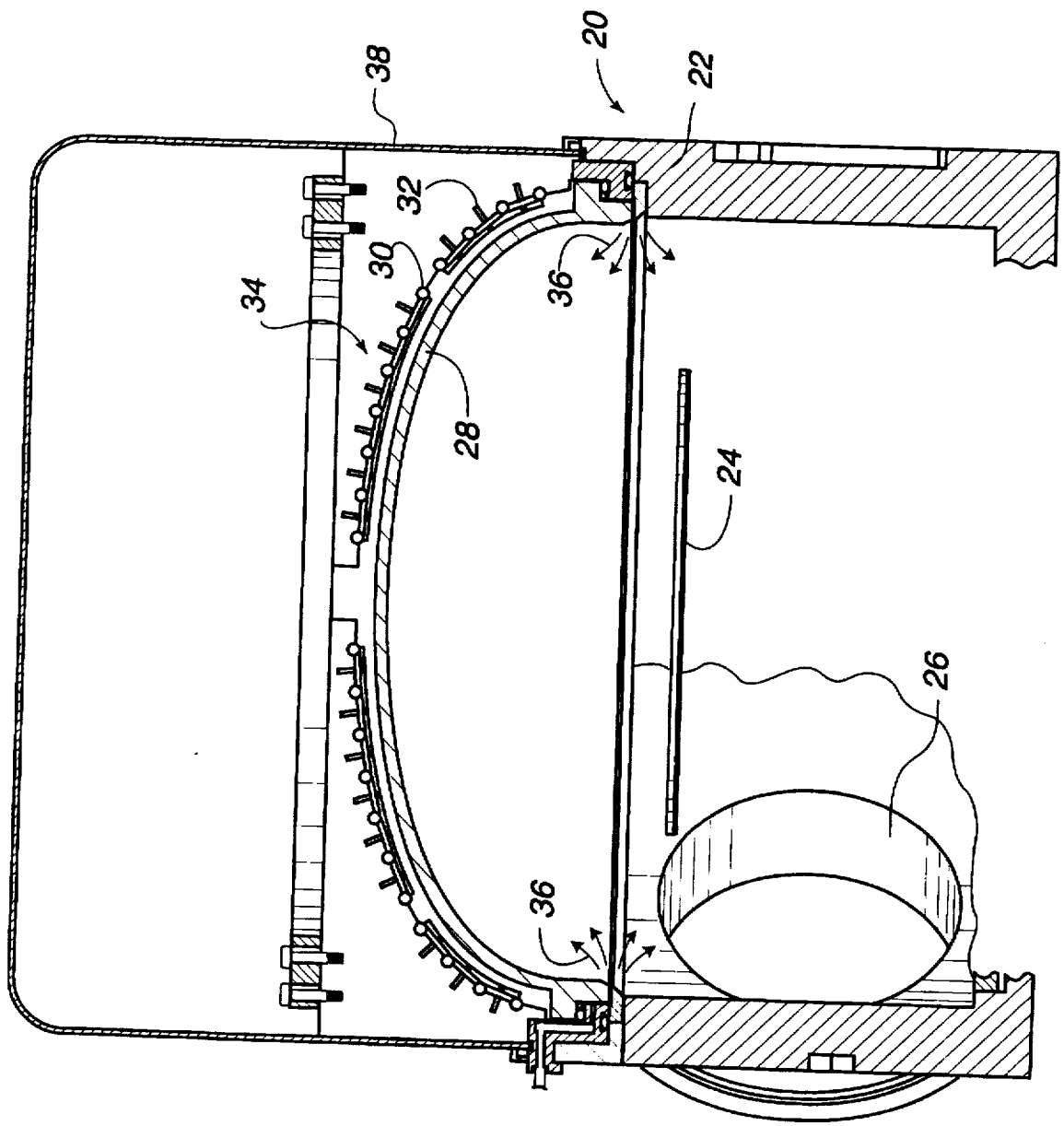
FIG. 1 shows a cross sectional view of a substrate processing chamber utilizing a ceramic dome to enclose its top portion.
Figure 2:
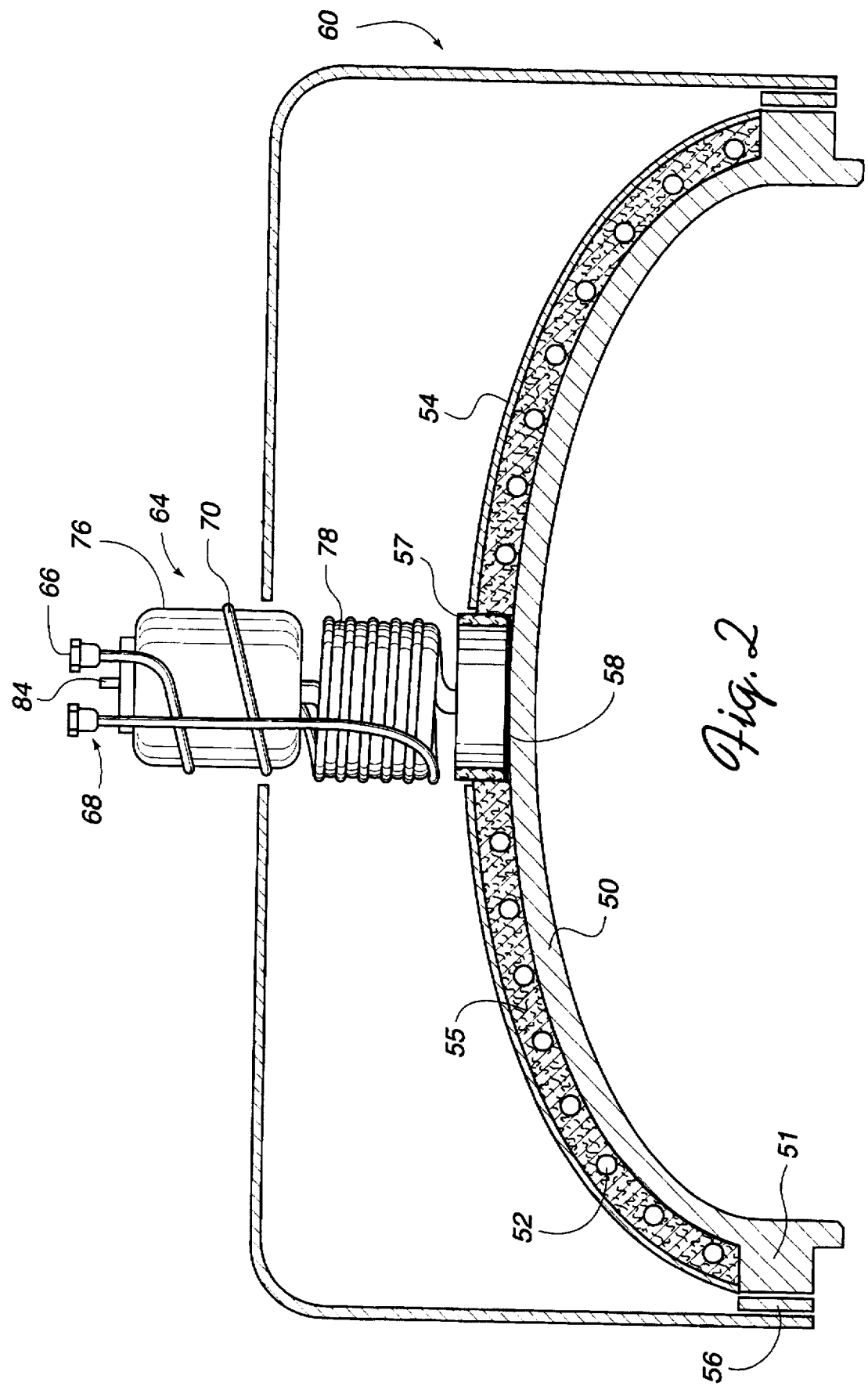
FIG. 2 shows a cross section of a ceramic dome section of a processing chamber according to the invention showing a heat pipe structure disposed adjacent to the top center of the ceramic dome.

One configuration according to the invention is shown in FIG. 2. A ceramic dome 50, on which a set of RF coils 52 are wound, is enclosed by a coil cover housing 54 to act as the ceramic dome structure at the top of the processing chamber shown in FIG. 1. Enclosed in the housing 54 is a thermal insulating material 55 to insure an isothermal temperature gradient on dome surfaces. The outside flange 51 of the ceramic dome 50 is surrounded by a band heater 56. A heat pipe structure 64 is located with its bottom surface in contact with the center top of the ceramic dome 50. A thermally conducting filler material 58 between the bottom of the heat pipe structure 64 and the top of the dome 50 assures conductive heat transfer between the two. Actual details of the construction of the heat pipe structure apart from that described herein are only known to and adjusted by the supplier of the heat pipe structure (Noren Products, Inc., 110 O'Brien Drive, Menlo Park, Calif. 94025). In general, the configuration of the heat pipe structure 64 is shown in FIGS. 2, 3, 4 and 5.

Figure 5:
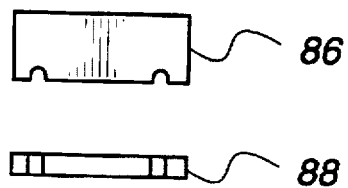
FIG. 5 shows a cooling tubing bracket as used in FIG. 4.
Figure 4:
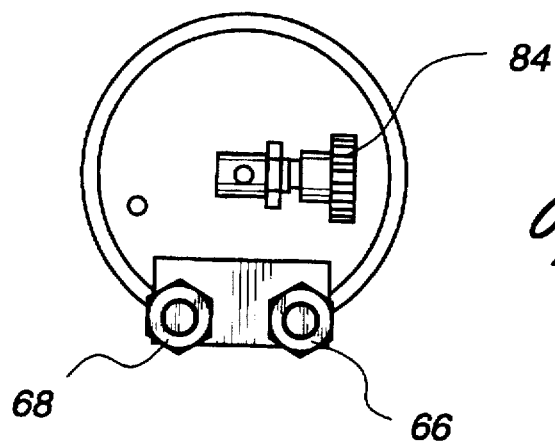
FIG. 4 shows a top view of the heat pipe structure of FIG. 3.
Figure 3:
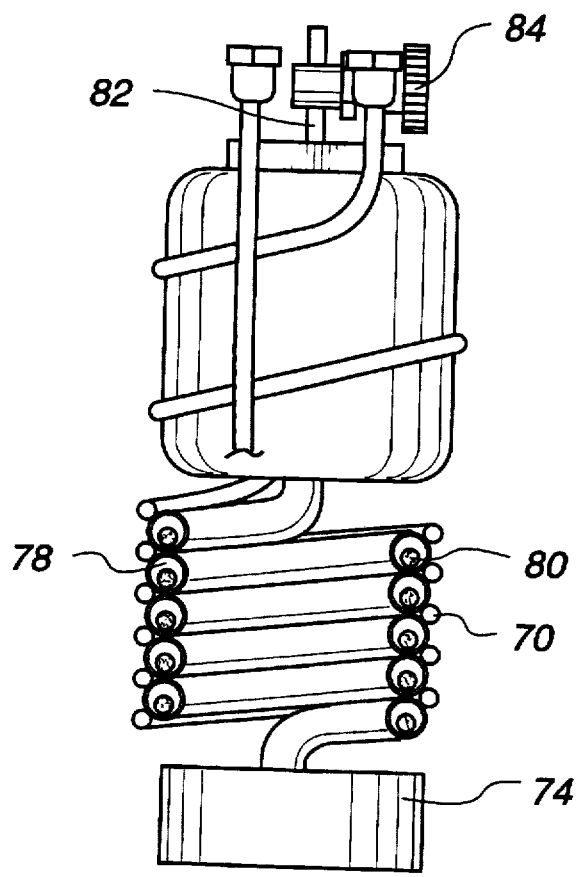
FIG. 3 shows a partial cross sectional view of a heat pipe structure of FIG. 2.

In a cooling mode, the boiling chamber 74 will vaporize the heat pipe heat transfer liquid which will expand until it reaches the upper reservoir/condensation chamber 76. The heat pipe is formed in a spiral to provide additional pipe length without increasing the size of the heat removing structure. The heat pipe contains a wick (depicted as the circle 80 in the drawings). A liquid cooling tube 70 is soldered or otherwise thermal conductively joined to the spirally wound heat pipe 78 and the condensation chamber 76 to provide heating and/or cooling to the heat pipe structure 64. The set point of the temperature stabilization is set by increasing or decreasing the pressure of the thermal transfer fluid (produced and selected by Noren Products, Inc.), such that changing the pressure of the vapor above the heat pipe thermal transfer fluid, for example by opening and closing the heat pipe pressurization connection valve 84 connected to the heat pipe pressurization connection 82 will change the heat pipe temperature set point as desired. A set of cooling tube brackets 86, 88 shown in FIG. 5 are welded or soldered to the top of the condensation chamber or heat pipe to the condensation chamber 76.

In operation, the peripheral band heater 56 and a second alternative heater band 57 at the base end of the heat pipe are preheated to raise the temperature of the ceramic dome during the time when the thermal energy from the process is not sufficient to maintain the temperature of the dome. Built in thermostats will turn off the heaters when the set point temperature is reached. Additional heat generated during processing is removed by the heat pipe by cooling/heating liquid circulated through the cooling liquid tubing 70 wrapped on the heat pipe.

During operation the thermal energy generated by the substrate deposition or etching process heats the ceramic dome and the lower reservoir of the heat pipe causing the boiling chamber 74 to boil (vaporize) the heat transfer liquid in the heat pipe structure 64. The vaporized liquid expands through the spirally wound tubing 78 and into the upper (condensation) chamber 76 of the heat pipe structure. As the temperature of the vapor increases, the vapor will tend to condense on the cool walls of the chamber and return to the lower boiling chamber 74. The liquid circulating in the spirally wound tubing 70 further assists in cooling and condensing the heat transfer liquid in the heat pipe structure.

Figure 6:
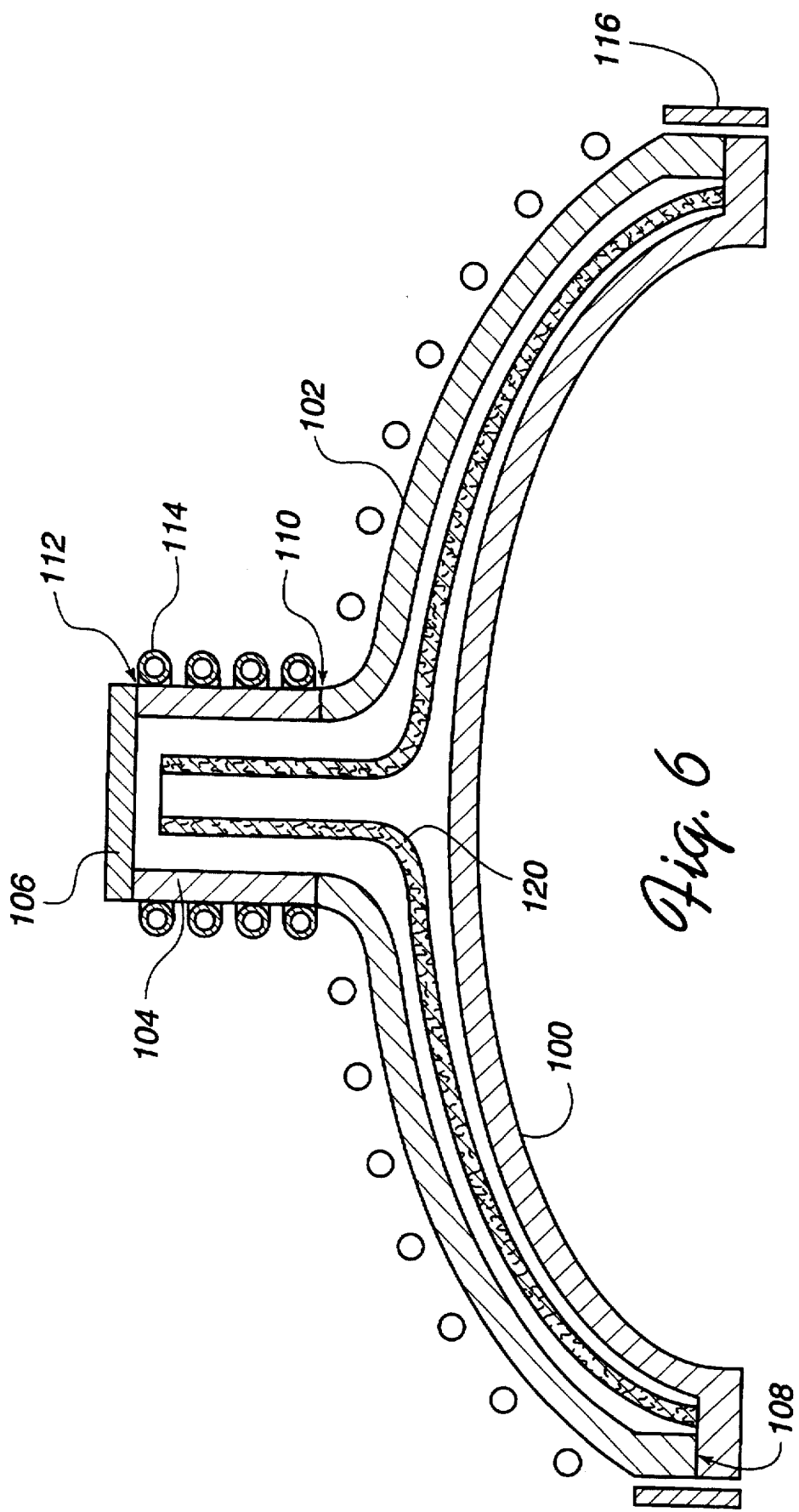
FIG. 6 shows a cross section of another configuration of a ceramic dome/heat pipe according to the invention.

Another configuration according to the invention is shown in FIG. 6. In FIG. 6 the actual ceramic dome 100 forms part of the heat pipe structure with an upper ceramic dome and nozzle 102 connected to a conductive core pipe 104 capped by a top plate 106 (a reservoir portion). The joints between each of these connections are made by common adhesive or sputter bonding connections such that the temperatures and pressures contained within the heat pipe structure are contained. For example, silver solder could be used at each of the joints 108, 110, 112. In each instance the inverted funnel shaped wick 120 provides the "condensate pump" of the heat pipe to move the condensed liquid back to a location adjacent to its boiling point. Cooling pipes 104 surround the thermally conductive core pipe 114 and provide a cooling or heating action as appropriate during the heating or cooling activities.

Figure 7:
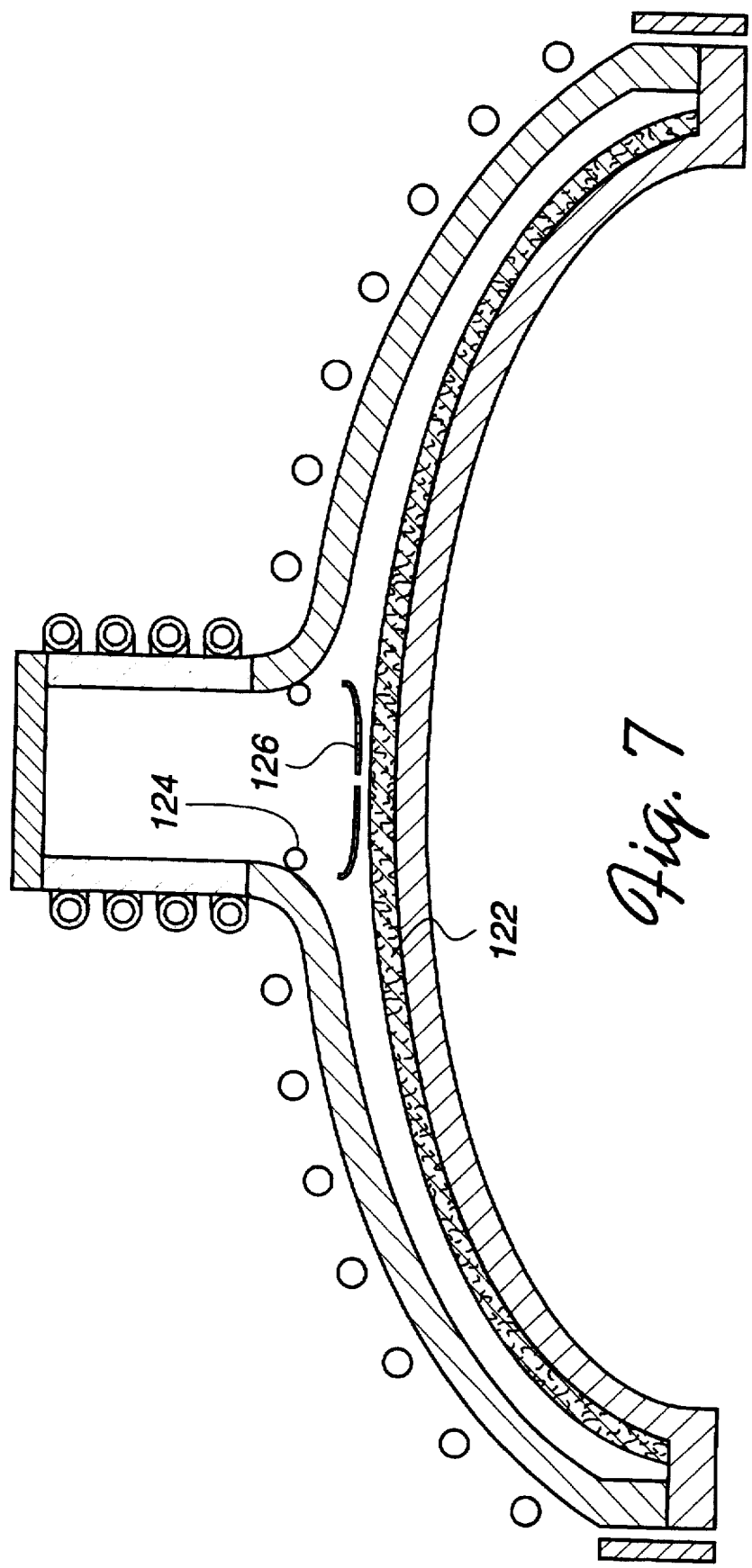
FIG. 7 shows a different wick configuration for the heat dome configuration of FIG. 6 and also includes a drip ring.

FIG. 7 shows an alternate configuration according to the invention using the basic structure of the heat pipe as shown in FIG. 6. In this instance a wick 122 completely covers the back of the ceramic dome 100 and any heat transfer liquid which is boiled/vaporized from the wick travels into the condensation section where it is cooled. Cooled liquid forms droplets which travel downwards along the wall of the thermally conductive core pipe 104 and would continue to run down the inside of the upper ceramic dome 102 if it were not for a drip ring 124 which causes condensed liquid to drip from the drip ring into a condensed fluid collection cup 126 which has a hole in its center thereby supplying the center top of the wick with newly returned cooled thermal transfer liquid which can be then distributed evenly around the dome shaped wick.

FIG. 8 shows another configuration according to the invention showing a drip ring 130 and condensed fluid collection cup 132 which collects dripped fluid which is not transported through the dome to heat transfer section wick 128. The wick 128 is configured to cover the dome but also has a central trunk which rises to the top plate 106 and then spreads out in a cylindrical manner along the walls of the conductive core pipe 104. In this way this configuration can both heat and cool the inner ceramic surface utilizing the principle of a heat pipe as is generally understood. While the wick 128 is shown separated from the walls of the heat pipe in FIG. 8, it can be configured to fill the entire void of the heat pipe to provide similar heat transfer performance.

FIG. 8 also pictures another configuration of cooling fluid tubing 118 (shown in dashed lines) located inside the fluid cavity of the heat pipe.

Persons of ordinary skill will also understand that this structure provides a method of thermally stabilizing (controlling) a ceramic dome (surface) of a vacuum chamber. Such a method includes the steps of equipping a substrate processing chamber with a wall whose temperature is elevated during processing of a substrate; placing a portion of a heat pipe in contact with an outside portion of the wall; and circulating heat transfer fluid through a passage in thermally conductive contact with the heat pipe. The step of placing can include providing a thermal transfer filler material between the heat pipe and the outside portion of the wall.

Another method includes the steps of: equipping a substrate processing chamber with a wall whose temperature is elevated during processing of a substrate, wherein a first surface of the wall is part of the inside surface of the processing chamber and a second surface of the wall is opposite the first surface; a portion of the second surface being enclosed and sealed to a cover member enclosing a cavity therebetween, the cavity containing a wick and thermal transfer fluid to form a heat pipe; circulating heat transfer fluid through a fluid passage in thermally conductive contact with the heat pipe; where the cover member may include includes a reservoir portion in thermally conductive contact with the fluid passage.

While the invention has been described with regards to specific embodiments, those skilled in the art will recognize that changes can be made in form and detail without departing from the spirit and scope of the invention.

We claim:

1. A vacuum chamber comprising:
   a vacuum chamber wall, a transparent portion of said wall being substantially transparent to an RF frequency field, said wall having a first surface facing a substrate processing location within said chamber and a second surface of said wall opposite said first surface; and
   a cover member sealed to a portion of said second surface creating a sealed cavity between said cover member and a transparent portion of said second surface, wherein a transparent portion of said cover member facing said transparent portion of said vacuum chamber wall is also substantially transparent to an RF frequency field;
   wherein said sealed cavity contains a wick and heat pipe fluid, said wick being configured to cause said sealed cavity to act as a heat pipe;
   wherein an RF frequency field is located outside said vacuum chamber at a location corresponding to the transparent portion of said chamber wall.

2. The vacuum chamber as in claim 1,
   wherein said cover member includes a condenser portion in thermal contact with tubing through which thermal transfer liquid may flow.

3. The vacuum chamber as in claim 2,
   wherein said condenser portion of said cover member in thermal contact with tubing through which thermal transfer liquid may flow is a metal.

4. A method of controlling the temperature of a surface of a substrate vacuum processing chamber adjacent to which an RF frequency field is present including the steps of:
   equipping said substrate vacuum processing chamber with a wall having a ceramic portion which is transparent to an RF frequency field whose temperature is elevated during processing of a substrate, wherein a first surface of said wall is part of the inside surface of said substrate vacuum processing chamber and a second surface of said wall is opposite said first surface;
   enclosing and sealing a portion of said second surface to a cover member also having a ceramic portion that is transparent to an RF frequency field, the location of said ceramic portion correlating to the location of the ceramic portion in said wall of said processing chamber such that together they are transparent to an RF frequency field, said cover member enclosing a cavity between said cover member and said second side of said second surface,
   providing a wick and thermal transfer fluid in said cavity so that it acts as a heat pipe.

5. The method of controlling the temperature of a surface of a vacuum chamber as in claim 4, further including the step of:
   circulating heat transfer fluid through a fluid passage in thermally conductive contact with said heat pipe.

6. The method of controlling the temperature of a surface of a vacuum chamber as in claim 5, wherein said cover member includes a reservoir portion in thermally conductive contact with said fluid passage.

7. A vacuum chamber surface temperature control apparatus comprising:

a heat transfer fluid captured in a heat pipe enclosure;

a wall of a processing chamber having a ceramic portion that is transparent to an RF frequency field having a first side facing a substrate processing location in said processing chamber and a second side in thermal contact with said heat transfer fluid in said heat pipe enclosure;

wherein a portion of said heat pipe enclosure adjacent said ceramic portion is also transparent to an RF frequency field such an RF frequency field passes through a portion of said heat pipe enclosure and said wall of said processing chamber into said processing chamber.

8. The vacuum chamber surface temperature control apparatus as in claim 7, wherein thermal contact between said second side and said heat transfer fluid is through said wall of the chamber in thermal contact with a wall of said heat pipe enclosure; wherein said wall of the chamber is integral with said wall of said heat pipe enclosure.

* * * * *